US012587166B2

(12) United States Patent
Noguchi

(10) Patent No.: US 12,587,166 B2
(45) Date of Patent: Mar. 24, 2026

(54) LONGITUDINALLY COUPLED RESONATOR ACOUSTIC WAVE FILTER

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 281 days.

(21) Appl. No.: 18/125,166

(22) Filed: Mar. 23, 2023

(65) Prior Publication Data

US 2023/0246628 A1     Aug. 3, 2023

Related U.S. Application Data

(63) Continuation of application No. PCT/JP2021/034858, filed on Sep. 22, 2021.

(30) Foreign Application Priority Data

Oct. 8, 2020     (JP) ................................. 2020-170635

(51) Int. Cl.
| | |
|---|---|
| *H03H 9/145* | (2006.01) |
| *H03H 9/25* | (2006.01) |
| *H03H 9/64* | (2006.01) |

(52) U.S. Cl.
CPC .............. *H03H 9/145* (2013.01); *H03H 9/25* (2013.01); *H03H 9/64* (2013.01)

(58) Field of Classification Search
CPC .............. H03H 9/145; H03H 9/25; H03H 9/64
(Continued)

(56) References Cited

U.S. PATENT DOCUMENTS

| | | |
|---|---|---|
| 2002/0017969 A1 | 2/2002 | Takamine |
| 2012/0306594 A1 | 12/2012 | Tanaka |

(Continued)

FOREIGN PATENT DOCUMENTS

| | | |
|---|---|---|
| JP | 10290141 A | 10/1998 |
| JP | 2002314367 A | 10/2002 |

(Continued)

OTHER PUBLICATIONS

International Search Report in PCT/JP2021/034858, mailed Dec. 7, 2021, 3 pages.

(Continued)

*Primary Examiner* — Andrea Lindgren Baltzell
*Assistant Examiner* — Abigail Amir Yaldo
(74) *Attorney, Agent, or Firm* — Keating & Bennett, LLP

(57) ABSTRACT

A longitudinally coupled resonator acoustic wave filter includes first and second IDT electrodes on a piezoelectric substrate. A direction in which electrode fingers of the IDT electrodes extend is a first direction, a direction perpendicular or substantially perpendicular to the first direction is a second direction, a ground-side busbar of the first IDT electrode and a hot-side busbar of the second IDT electrode face each other in the second direction, and the longitudinally coupled resonator acoustic wave filter includes a projecting portion, connected to the ground-side busbar of the first IDT electrode, that extends in the second direction toward the second IDT electrode beyond an interdigitated region of the first IDT electrode.

17 Claims, 8 Drawing Sheets

(58) Field of Classification Search
    USPC ........................................................ 333/193
    See application file for complete search history.

(56)                    References Cited

U.S. PATENT DOCUMENTS

| 2019/0131955 | A1* | 5/2019 | Kaneda | ................ | H03H 9/6483 |
| 2019/0379354 | A1* | 12/2019 | Yasuda | ................. | H03H 9/059 |

FOREIGN PATENT DOCUMENTS

| JP | 3391346 | B2 | 3/2003 |
| JP | 2004120184 | A | 4/2004 |
| WO | 2011099532 | A1 | 8/2011 |

OTHER PUBLICATIONS

Written Opinion in PCT/JP2021/034858, mailed Dec. 7, 2021, 4 pages.

* cited by examiner

SECOND
DIRECTION

FIRST DIRECTION

LONGITUDINALLY COUPLED RESONATOR ACOUSTIC WAVE FILTER

CROSS REFERENCE TO RELATED APPLICATIONS

This application claims the benefit of priority to Japanese Patent Application No. 2020-170635 filed on Oct. 8, 2020 and is a Continuation Application of PCT Application No. PCT/JP2021/034858 filed on Sep. 22, 2021. The entire contents of each application are hereby incorporated herein by reference.

BACKGROUND OF THE INVENTION

1. Field of the Invention

The present invention relates to a longitudinally coupled resonator acoustic wave filter including a plurality of IDT electrodes positioned along a propagation direction of an acoustic wave.

2. Description of the Related Art

Japanese Patent No. 3391346 below discloses a longitudinally coupled resonator acoustic wave filter having a plurality of IDT electrodes. In two adjacent IDT electrodes, the hot-side busbar of one IDT electrode and the ground-side busbar of the other IDT electrode are aligned with each other in the propagation direction of an acoustic wave. The ground-side busbar of one IDT electrode and the hot-side busbar of the other IDT electrode are aligned with each other in the propagation direction of an acoustic wave.

SUMMARY OF THE INVENTION

The longitudinally coupled resonator acoustic wave filter described above has a problem in that undesirable electromagnetic field coupling occurs between the hot-side busbar of one IDT electrode and the hot-side busbar of the other IDT electrode, thereby degrading attenuation characteristics.

Preferred embodiments of the present invention provide longitudinally coupled resonator acoustic wave filters in each of which attenuation characteristics do not easily degrade.

A longitudinally coupled resonator acoustic wave filter according to a preferred embodiment of the present invention includes a piezoelectric substrate, a first IDT electrode on the piezoelectric substrate, and IDT electrode on the piezoelectric substrate so as to be adjacent to the first IDT electrode, in which the first IDT electrode includes a hot-side busbar connected to a hot-side potential, a ground-side busbar connected to a ground-side potential, a plurality of first electrode fingers connected to the hot-side busbar, and a plurality of second electrode fingers connected to the ground-side busbar, the second IDT electrode includes a hot-side busbar connected to a hot-side potential, a ground-side busbar connected to a ground-side potential, a plurality of third electrode fingers connected to the hot-side busbar, and a plurality of fourth electrode fingers connected to the ground-side busbar, when a direction in which the first to fourth electrode fingers extend is a first direction, a direction perpendicular or substantially perpendicular the first direction is a second direction, and a region in which the plurality of first electrode fingers and the plurality of second electrode fingers of the first IDT electrode overlap each other in the second direction is an interdigitated region of the first IDT electrode and a region in which the plurality of third electrode fingers and the plurality of fourth electrode fingers of the second IDT electrode overlap each other in the second direction is an interdigitated region of the second IDT electrode, the ground-side busbar of the first IDT electrode and the hot-side busbar of the second IDT electrode face each other in the second direction, the hot-side busbar of the first IDT electrode and the ground-side busbar of the second IDT electrode face each other in the second direction, and a projecting portion extending in the second direction toward the second IDT electrode beyond the interdigitated region of the first IDT electrode is provided, the projecting portion being connected to the ground-side busbar of the first IDT electrode.

According to preferred embodiments of the present invention, it is possible to provide longitudinally coupled resonator acoustic wave filters in each of which attenuation characteristics do not easily degrade.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments of the present invention with reference to the drawings.

It should be noted that the preferred embodiments described in this specification are exemplary and that partial replacement or combination of the structures is possible between different preferred embodiments.

Figure 1:
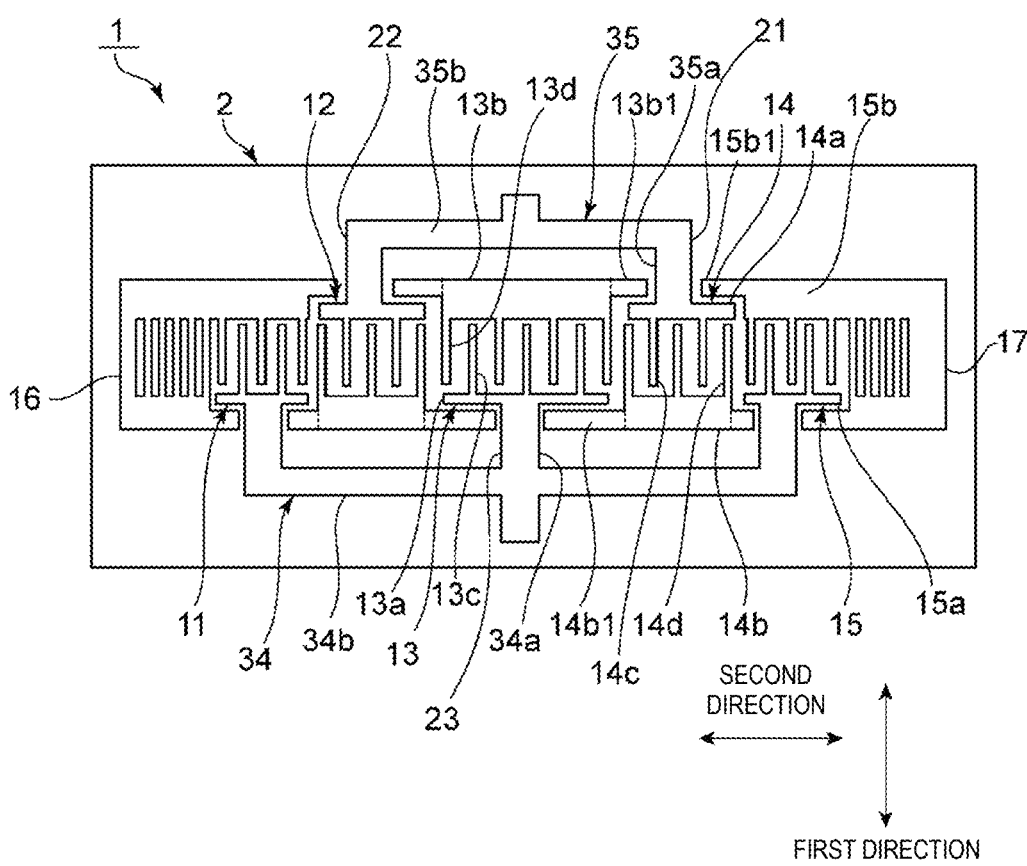
FIG. 1 is a plan view of a longitudinally coupled resonator acoustic wave filter according to a first preferred embodiment of the present invention.

FIG. 1 is a plan view of a longitudinally coupled resonator acoustic wave filter according to a first preferred embodiment of the present invention. A longitudinally coupled resonator acoustic wave filter 1 includes a piezoelectric substrate 2. The piezoelectric substrate 2 includes an appropriate piezoelectric material such as LiTaO₃ or LiNbO₃.

IDT electrodes 11 to 15 are disposed in the propagation direction of an acoustic wave on the piezoelectric substrate 2. Reflectors 16 and 17 are provided on both sides of the region in which the IDT electrodes 11 to 15 are provided. This provides a 5-IDT-type longitudinally coupled resonator surface acoustic wave filter. It should be noted that a film made of a dielectric may be provided on the piezoelectric substrate 2 so as to cover the IDT electrodes 11 to 15.

This longitudinally coupled resonator acoustic wave filter 1 is used as a reception filter for Band 66.

Figure 2:
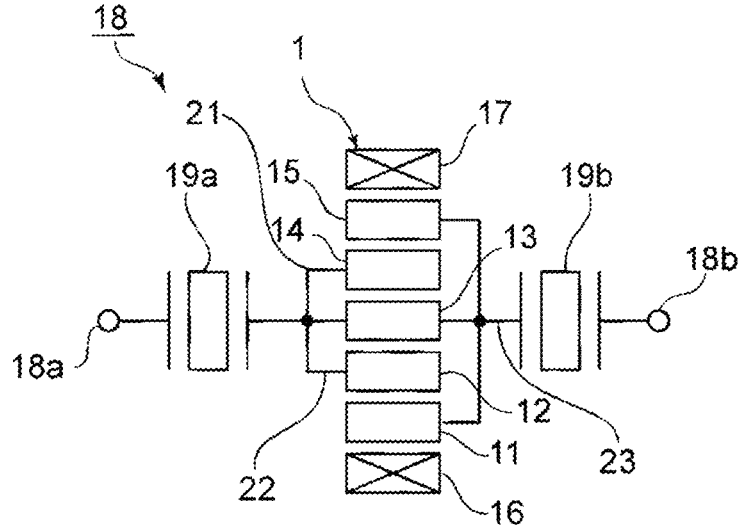
FIG. 2 is a circuit diagram of a reception filter having the longitudinally coupled resonator acoustic wave filter according to the first preferred embodiment of the present invention.

FIG. 2 is the circuit diagram of this reception filter. The reception filter 18 includes an antenna terminal 18a and a reception terminal 18b. A series resonator 19a, the longitudinally coupled resonator acoustic wave filter 1, and a series resonator 19b are connected to each other between the antenna terminal 18a and the reception terminal 18b. Although not particularly limited, the series resonators 19a and 19b include acoustic wave resonators.

Figure 3:
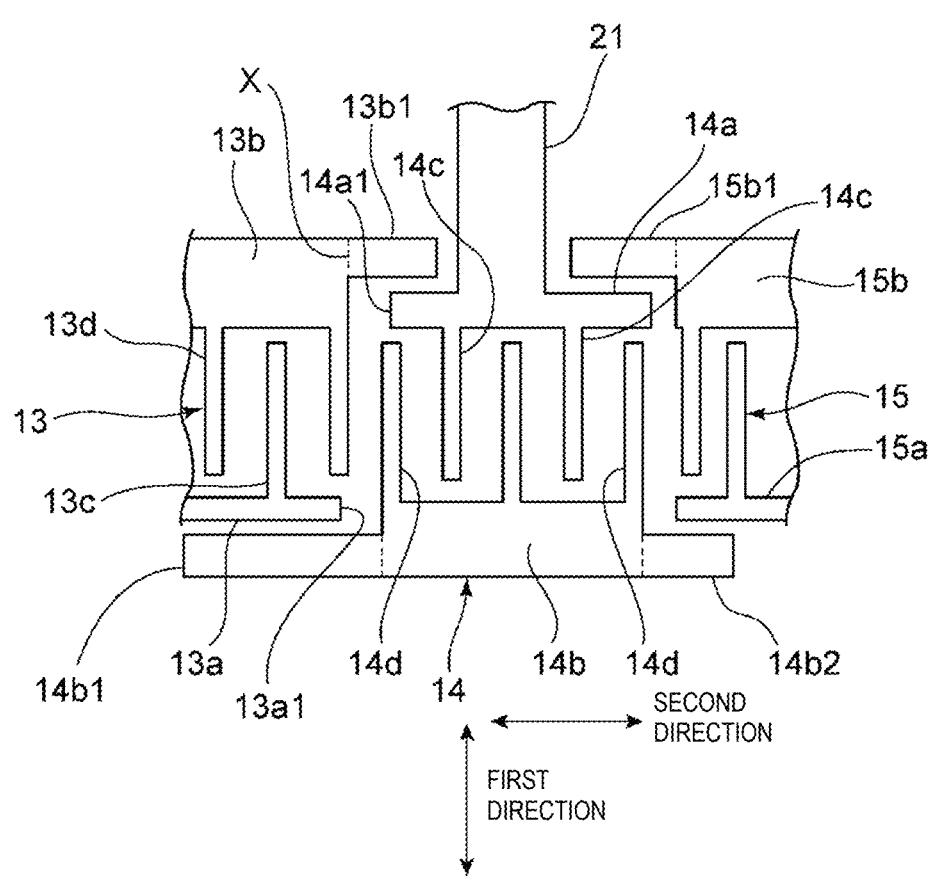
FIG. 3 is a schematic plan view illustrating the main portion of the longitudinally coupled resonator acoustic wave filter according to the first preferred embodiment of the present invention.

FIG. 3 is a schematic plan view illustrating the enlarged main portion of the longitudinally coupled resonator acoustic wave filter 1. FIG. 3 illustrates the portion in which the IDT electrode 13, the IDT electrode 14, and the IDT electrode 15 are provided.

When it is assumed that the IDT electrode 13 and the IDT electrode 15 correspond to the first IDT electrode, the IDT electrode 14 corresponds to the second IDT electrode. The IDT electrode 13 includes a hot-side busbar 13a and a ground-side busbar 13b. In this specification, the hot-side busbar is a busbar connected to a hot-side potential. The ground-side busbar is a busbar connected to a ground-side potential. A plurality of electrode fingers 13c as a plurality of first electrode fingers are connected to the hot-side busbar 13a. A plurality of electrode fingers 13d as a plurality of second electrode fingers are connected to the ground-side busbar 13b. The plurality of electrode fingers 13c and the plurality of electrode fingers 13d are interdigitated with each other.

It should be noted that the direction in which the plurality of electrode fingers 13c and 13d extend is referred to as a first direction in this specification. In addition, the direction perpendicular or substantially perpendicular the first direction on the piezoelectric substrate 2 is the second direction. The second direction is the propagation direction of an acoustic wave.

The IDT electrode 14 also has a hot-side busbar 14a and a ground-side busbar 14b. Connection wiring 21 is connected to the hot-side busbar 14a. A plurality of electrode fingers 14c as the plurality of third electrode fingers are connected to the hot-side busbar 14a. A plurality of electrode fingers 14d as the plurality of fourth electrode fingers are connected to the ground-side busbar 14b. As illustrated in FIGS. 1 and 2, the connection wiring 21 and the connection wiring 22 connected to the IDT electrode 12 are connected together.

It should be noted that the hot-side busbar 13a of the IDT electrode 13 is connected to the connection wiring 23.

As illustrated in FIG. 3, the ground-side busbar 13b of the IDT electrode 13 and the hot-side busbar 14a of the IDT electrode 14 are aligned with each other in the second direction. Similarly, the hot-side busbar 13a of the IDT electrode 13 and the ground-side busbar 14b of the IDT electrode 14 are aligned with each other in the second direction.

The ground-side busbar 13b has a projecting portion 13b1. The projecting portion 13b1 extends from the ground-side busbar 13b toward the hot-side busbar 14a of the IDT electrode 14 as the second IDT electrode, that is, in the second direction. In the present preferred embodiment, the projecting portion 13b1 extends to a position that overlaps the hot-side busbar 14a in the first direction. That is, the projecting portion 13b1 extends toward the IDT electrode 14 beyond an end portion 14al of the hot-side busbar 14a close to the IDT electrode 13. Here, dashed line X indicates the boundary between the ground-side busbar 13b and the projecting portion 13b1. When it is assumed that the interdigitated region is the region in which the plurality of electrode fingers 13c and the plurality of electrode fingers 13d are interdigitated with each other, the ground-side busbar 13b is the portion extending in the second direction in a region overlapping the interdigitated region as viewed in the first direction. The projecting portion 13b1 extends to the outer side portion in the second direction beyond the interdigitated region described above.

As illustrated in FIG. 3, the ground-side busbar 14b of the IDT electrode 14 also has a projecting portion 14b1 provided on the side of the IDT electrode 13. The projecting portion 14b1 extends toward the IDT electrode 13 as the first IDT electrode beyond the end portion 13al of the hot-side busbar 13a.

The longitudinally coupled resonator acoustic wave filter 1 includes the projecting portions 13b1 and 14b1 described above so as to suppress the electromagnetic field coupling between the hot-side busbar 13a and the hot-side busbar 14a. That is, since the projecting portion 13b1 connected to the ground-side busbar 13b is provided near the hot-side busbar 14a, the electromagnetic field is induced from the hot-side busbar 14a toward the projecting portion 13b1. Similarly, since the projecting portion 14b1 is provided near the hot-side busbar 13a, the electromagnetic field is induced from the hot-side busbar 13a toward the portion projecting 14b1. Accordingly, the electromagnetic field coupling between the hot-side busbar 13a and the hot-side busbar 14a becomes smaller. This reduces attenuation.

This will be clarified by describing the characteristics of the examples and the comparative examples described below.

The reception filter 18 illustrated in FIG. 2 is formed as example 1. In example 1, each of the IDT electrodes 11 to 15 includes a main portion and a narrow-pitch portion. The electrode finger pitch in the narrow-pitch portion is smaller than the electrode finger pitch in the main portion. The electrode finger pitch refers to the distance between the middle of each of the adjacent electrode fingers. The narrow-pitch portion is located in a portion adjacent to another IDT electrode. It should be noted that example 1 is an example and the electrode finger pitch of each of the IDT electrodes 11 to 15 may be constant. Furthermore, in example 1, a dielectric film is provided on the piezoelectric substrate 2 so as to cover the IDT electrodes 11 to 15.

Here, the design parameters the longitudinally coupled resonator acoustic wave filter 1 will be described below. The wavelength defined by the electrode finger pitch is A. When the electrode finger pitch is not constant, the average value of electrode finger pitches may be used to define the wavelength A. The dimension in the first direction of the interdigitated region is the interdigitated width. In the design parameters, "electrodes" includes the IDT electrodes 11 to 15 and the reflectors 16 and 17.

6

Number of pairs of electrode fingers (reflector, IDT electrode, reflector): 10 pairs, 92.5 pairs, 10 pairs
Materials of electrode from piezoelectric substrate 2: Nicr, Pt, Ti, AlCu, Ti
Material of dielectric film: SiO$_2$
Film thicknesses of layers of electrode from piezoelectric substrate 2: about 10 nm, 35 nm, 10 nm, 130 nm, 10 nm
Film thickness of dielectric film: about 500 nm
The series resonator 19b includes the acoustic wave resonator described below.
Mode used: LN Rayleigh
Electrode finger pitch (reflector, IDT electrode, reflector): about 1.712 μm, 1.646 μm, 1.712 μm

TABLE 1

| | RE-FLECTOR 16 | IDT ELEC-TRODE 11 MAIN PORTION | IDT ELEC-TRODE 11 NARROW-PITCH PORTION | IDT ELEC-TRODE 12 NARROW-PITCH PORTION | IDT ELEC-TRODE 12 MAIN PORTION | IDT ELEC-TRODE 12 NARROW-PITCH PORTION | IDT ELEC-TRODE 13 NARROW-PITCH PORTION | IDT ELEC-TRODE 13 MAIN PORTION | IDT ELEC-TRODE 13 NARROW-PITCH PORTION |
|---|---|---|---|---|---|---|---|---|---|
| ELEC-TRODE FINGER PITCH [μm] | 1.785 | 1.7 | 1.591 | 1.573 | 1.705 | 1.579 | 1.588 | 1.697 | 1.588 |
| NUMBER OF PAIRS OF ELEC-OTRDE FINGERS | 10 | 20.5 | 3.5 | 3.5 | 23 | 3.5 | 3.5 | 24 | 3.5 |

Interdigitated width: about 28.5 μm

TABLE 2

| | IDT ELECTRODE 14 NARROW-PITCH PORTION | IDT ELECTRODE 14 MAIN PORTION | IDT ELECTRODE 14 NARROW-PITCH PORTION | IDT ELECTRODE 15 NARROW-PITCH PORTION | IDT ELECTRODE 15 MAIN PORTION | REFLECTOR 17 |
|---|---|---|---|---|---|---|
| ELECTRODE FINGER PITCH [μm] | 1.579 | 1.705 | 1.573 | 1.591 | 1.7 | 1.785 |
| NUMBER OF PAIRS OF ELECTRODE FINGERS | 3.5 | 23 | 3.5 | 3.5 | 20.5 | 10 |

Figure 4:
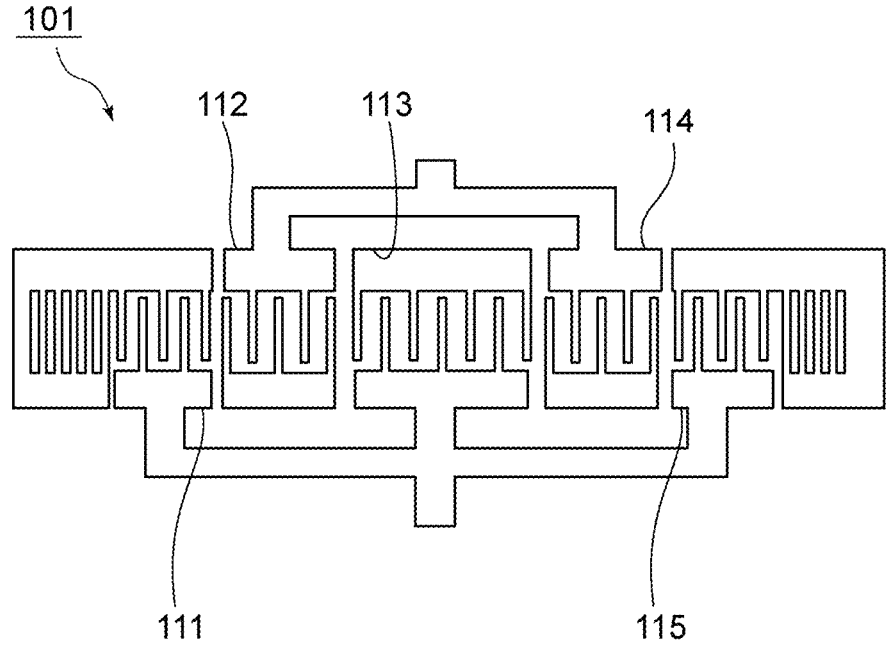
FIG. 4 is a plan view illustrating the electrode structure of a longitudinally coupled resonator acoustic wave filter according to a comparative example.

Average value of electrode finger pitches: about 1.805 μm (λ=about 3.61 μm)
Mode used: LN Rayleigh
Interdigitated width: about 27 μm (7.5λ)
Materials of electrode from piezoelectric substrate 2: Nicr, Pt, Ti, AlCu, Ti
Material of dielectric film: SiO$_2$
Film thicknesses of layers of electrode from piezoelectric substrate 2: about 10 nm, 35 nm, 10 nm, 130 nm, 10 nm
Film thickness of dielectric film: about 500 nm
The series resonator 19a includes the acoustic wave resonator described below.
Mode used: LN Rayleigh
Electrode finger pitches (reflector, IDT electrode, reflector): about 1.718 μm, 1.652 μm, 1.718 μm
Interdigitated width: about 27.7 μm Number of pairs of electrode fingers (reflector, IDT electrode, reflector): 10 pairs, 121 pairs, 10 pairs
Materials of electrode from piezoelectric substrate 2: Nicr, Pt, Ti, AlCu, Ti
Material of dielectric film: SiO$_2$
Film thicknesses of layers of electrode from piezoelectric substrate 2: about 10 nm, 35 nm, 10 nm, 130 nm, 10 nm
Film thickness of dielectric film: about 500 nm
For comparison, a reception filter according to a comparative example having the same structure as example 1 except for a longitudinally coupled resonator acoustic wave filter 101 illustrated in FIG. 4 is used. In the longitudinally coupled resonator acoustic wave filter 101, the ground-side busbars of the IDT electrodes 111 to 115 have no projecting portions such that the width of the ground-side busbars, that is, the dimension in the first direction of the ground-side busbars, is the same as the width of the hot-side busbars. The reception filter according to the comparative example has the same structure as in the example with the exception of this.

Figure 5:
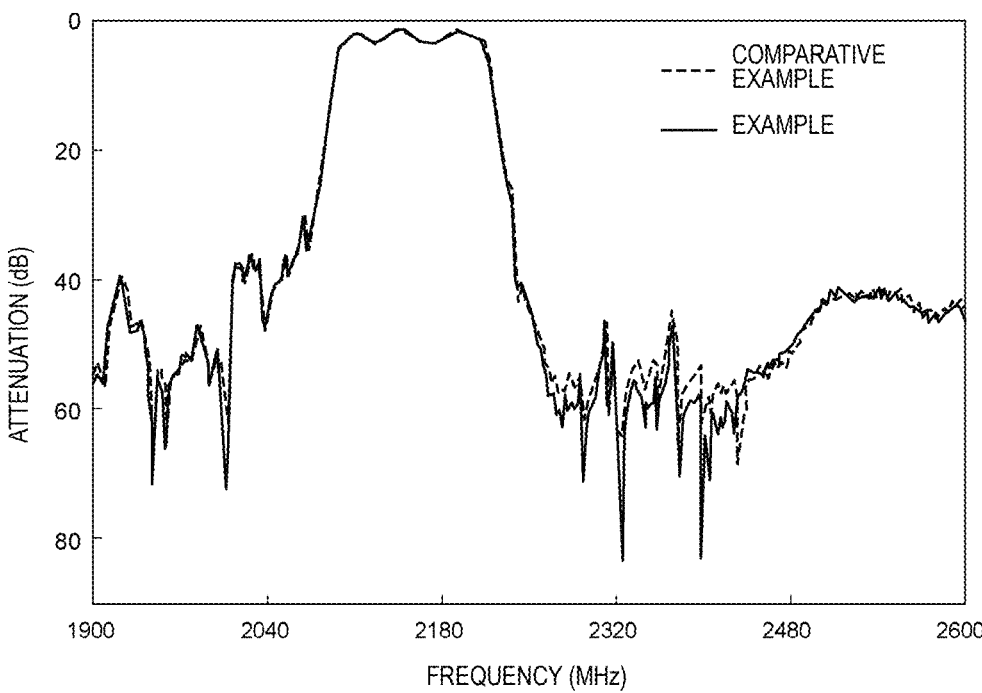
FIG. 5 is a diagram illustrating the attenuation versus the frequency characteristics of a reception filter according to an example and a reception filter according to a comparative example.

FIG. 5 is a diagram illustrating the attenuation versus the frequency characteristics of the reception filter according to the example and the reception filter according to the comparative example. The solid line indicates the result of the example, and the dashed line illustrates the result of the comparative example.

As is clear from FIG. 5, in the example, the attenuation in the attenuation region from about 2250 MHz to about 2480 MHZ, which is higher than the pass band, is larger than that in the comparative example. That is, in the longitudinally coupled resonator acoustic wave filter 1, the attenuation characteristics in the example have been improved compared with the attenuation characteristics in the comparative example. The electromagnetic field coupling between the adjacent hot-side busbars 13*a* and 14*a* is thought to have been suppressed because the projecting portions 13*b*1 and 14*b*1 are provided between the adjacent IDT electrodes 13 and 14 as described above.

It should be noted that, as illustrated in FIG. 3, in the portion in which the IDT electrode 14 and the IDT electrode 15 are adjacent to each other as well, the projecting portion 15*bl* is connected to the ground-side busbar 15*b* of the IDT electrode 15. In addition, the ground-side busbar 14*b* also has the projecting portion 14*b*2 extending toward the IDT electrode 15. Accordingly, the electromagnetic field coupling between the hot-side busbar 14*a* and the hot-side busbar 15*a* is also suppressed between the IDT electrodes 14 and 15. In the longitudinally coupled resonator acoustic wave filter 1, the projecting portions are similarly connected to the ground-side busbars in the portions other than the portion in which the IDT electrode 14 and the IDT electrode 13 are adjacent to each other and the portion in which the IDT electrode 14 and the IDT electrode 15 are adjacent to each other, in the portion in which the IDT electrode 11 and the IDT electrode 12 are adjacent to each other, and in the portion in which the IDT electrode 12 and the IDT electrode 13 are adjacent to each other as well. This improves the attenuation characteristics.

However, according to a preferred embodiment of the present invention, in a longitudinally coupled resonator acoustic wave filter including the plurality of IDT electrodes, at least one of the portions in which IDT electrodes are adjacent to each other need only be provided with the structure according to a preferred embodiment of the present invention, that is, the projecting portion. Preferably, projecting portions are provided in ground-side busbars in all the portions in which IDT electrodes are adjacent to each other as in the preferred embodiments described above. This can improve the attenuation characteristics more effectively.

Second to sixth preferred embodiments of the present invention will be described with reference to FIGS. 6A to 6C to FIG. 10. FIGS. 6A to 6C to FIG. 10 illustrate only the portions in which IDT electrodes are adjacent to each other in an enlarged view.

Figure 6A:
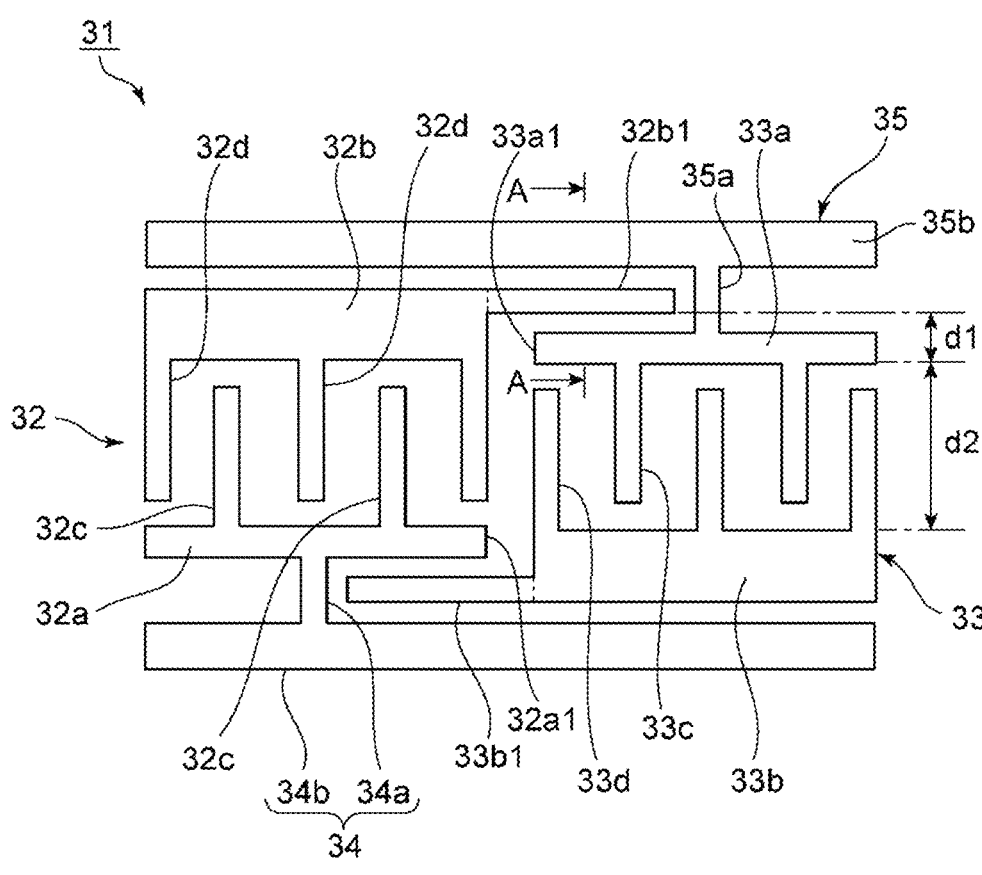
FIG. 6A is a plan view illustrating the main portion of the electrode structure of the longitudinally coupled resonator acoustic wave filter according to a second preferred embodiment of the present invention.

FIG. 6A is a plan view illustrating the main portion of the electrode structure of the longitudinally coupled resonator acoustic wave filter according to the second preferred embodiment of the present invention.

In a longitudinally coupled resonator acoustic wave filter 31, the IDT electrode 32 and the IDT electrode 33 are adjacent to each other in the propagation direction of an acoustic wave, that is, in the second direction. The IDT electrode 32 includes a hot-side busbar 32*a* and a ground-side busbar 32*b*. A projecting portion 32*b*1 is connected to the ground-side busbar 32*b*. A plurality of electrode fingers 32*c* as the plurality of first electrode fingers are connected to the hot-side busbar 32*a*. A plurality of electrode fingers 32*d* as the plurality of second electrode fingers are connected to the ground-side busbar 32*b*. Connection wiring 34 is connected to the hot-side busbar 32*a*. The connection wiring 34 includes a first wiring portion 34*a* connected to the hot-side busbar 32*a* and a second wiring portion 34*b* that is connected to the first wiring portion 34*a* and extends in the second direction.

In the IDT electrode 33 as well, a plurality of electrode fingers 33*c* are connected to the hot-side busbar 33*a*. A plurality of electrode fingers 33*d* are connected to the ground-side busbar 33*b*. A projecting portion 33*b*1 is connected to the ground-side busbar 33*b*.

The projecting portion 32*b*1 extends in the second direction toward the IDT electrode 33 beyond an end portion 33*a*1 of the hot-side busbar 33*a* close to the IDT electrode 32. Similarly, the projecting portion 33*b*1 extends in the second direction beyond an end portion 32*al* of the hot-side busbar 32*a* close to the IDT electrode 33.

Connection wiring 35 is connected to the hot-side busbar 33*a*. That is, a first wiring portion 35*a* of the connection wiring 35 is connected to the hot-side busbar 33*a*. The first wiring portion 35*a* extends in the first direction. In addition, a second wiring portion 35*b* extending in the second direction is connected to the first wiring portion 35*a*. Accordingly, the projecting portion 32*b*1 is provided so as to reach the region surrounded by the hot-side busbar 33*a*, the first wiring portion 35*a* of the connection wiring 35, and the second wiring portion 35*b*. Similarly, the projecting portion 33*b*1 extends to the region surrounded by the hot-side busbar 32*a*, the first wiring portion 34*a*, and the second wiring portion 34*b*.

Accordingly, the electromagnetic field is induced from the hot-side busbar 33*a* toward the projecting portion 32*b*1, and from the hot-side busbar 32*a* to the projecting portion 33*b*1. Therefore, the electromagnetic field coupling between the hot-side busbar 32*a* and the hot-side busbar 33*a* can be effectively suppressed, and the attenuation characteristics can be improved.

Preferably, when the distance between the projecting portion 32*b*1 described above and the edge of the hot-side busbar 33*a* close to the interdigitated region is d1, and the facing distance between the hot-side busbar 33*a* and the ground-side busbar 33*b* is d2, d1<d2 is satisfied. In this case, the electromagnetic field can be induced toward the projecting portion 32*b*1 more effectively, and the attenuation characteristics can be further improved.

Figure 6B:
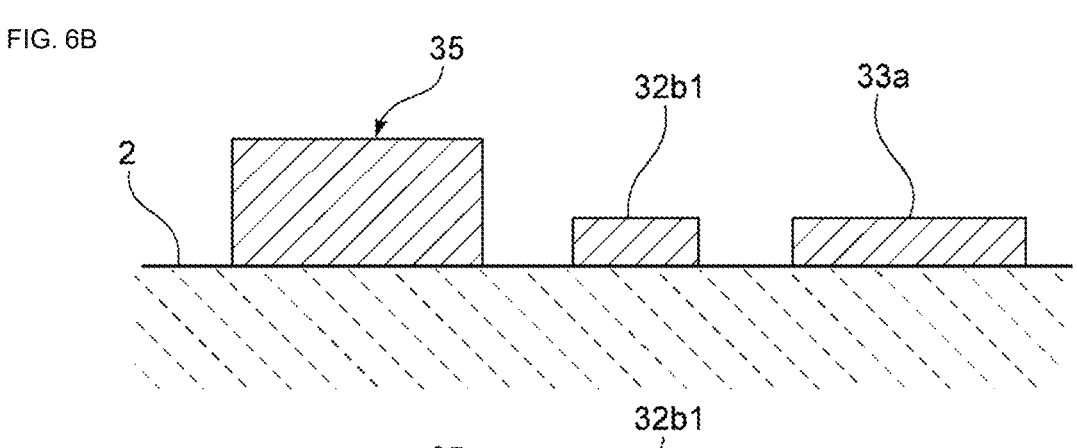
FIG. 6B is an enlarged sectional view of the portion taken along line A-A in FIG. 6A.

FIG. 6B is an enlarged sectional view of the portion taken along line A-A in FIG. 6A. In the present preferred embodiment, the height of the projecting portion 32*b*1 is lower than the height of the connection wiring 35. In this case, since the projecting portion 32*b*1 is provided at a position closer to the piezoelectric substrate 2, the electromagnetic field passing through the piezoelectric substrate 2 can be induced toward the projecting portion 32*b*1 more effectively.

Figure 6C:
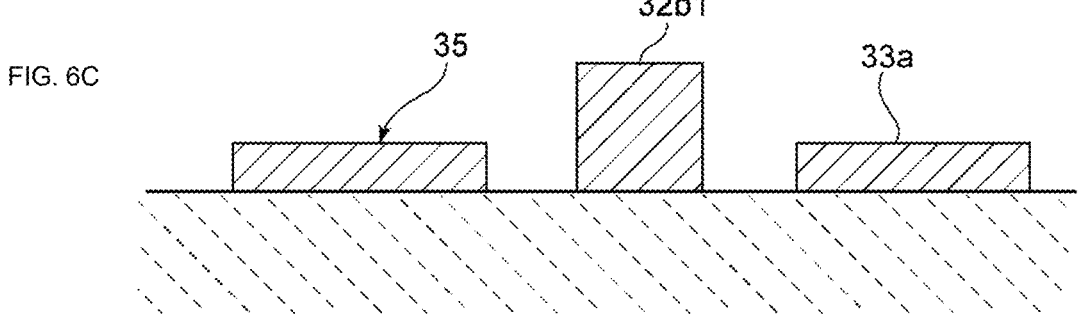
FIG. 6C is an enlarged sectional view illustrating a modification of the portion taken along line A-A in FIG. 6A.

Conversely, however, the height of the projecting portion 32*b*1 may be higher than the height of the connection wiring 35, which is the wiring portion on the hot side, as illustrated in FIG. 6C. In this case, by providing the projecting portion 32*b*1 at a position spaced away from the piezoelectric substrate having a relatively high dielectric constant, unnecessary capacitance between the projecting portion 32*bl* and the hot-side busbar 33*a* can be reduced.

Figure 7:
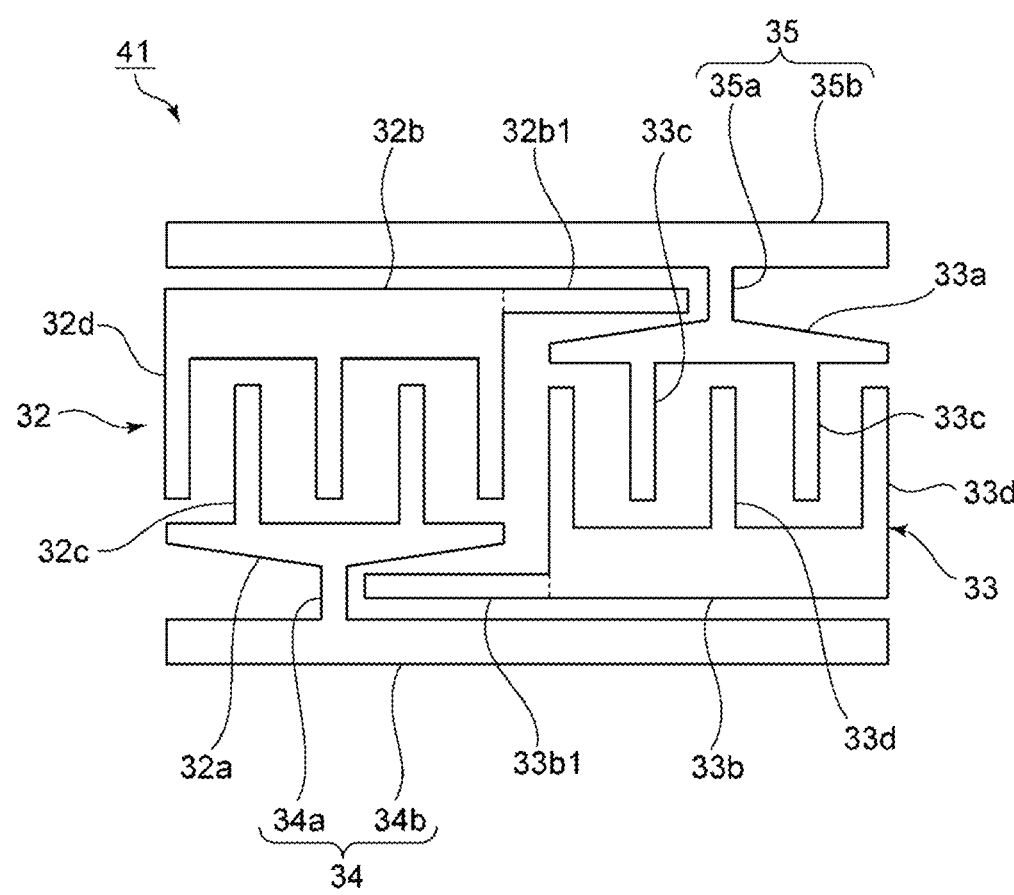
FIG. 7 is a plan view illustrating the main portion of the electrode structure of a longitudinally coupled resonator acoustic wave filter according to a third preferred embodiment of the present invention.

FIG. 7 is a plan view illustrating the main portion of the electrode structure of a longitudinally coupled resonator acoustic wave filter 41 according to the third preferred embodiment. In the longitudinally coupled resonator acoustic wave filter 41, in the IDT electrodes 32 and 33, the hot-side busbars 32*a* and 33*a* have a shape that tapers from the middle in the second direction toward both sides. It should be noted that the widths of the hot-side busbars 32*a* and 33*a* are the dimensions in the first direction. The other structure of the longitudinally coupled resonator acoustic wave filter 41 is the same as in the longitudinally coupled resonator acoustic wave filter 31.

In the present preferred embodiment as well, the projecting portion 32*b*1 and 33*b*1 are provided as in the second preferred embodiment to improve the attenuation characteristics. In addition, the widths of the hot-side busbars 32*a* and 33*a* taper toward both ends in the second direction. Accordingly, by increasing the widths of the hot-side busbars 32*a* and 33*a* in the middle in the second direction in which the current distribution is large and narrowing the end portion in the second direction that greatly contributes to coupling, the loss in the pass band can be suppressed effectively. That is, the attenuation characteristics can be improved while the effect on loss in the pass band is suppressed.

Figure 8:
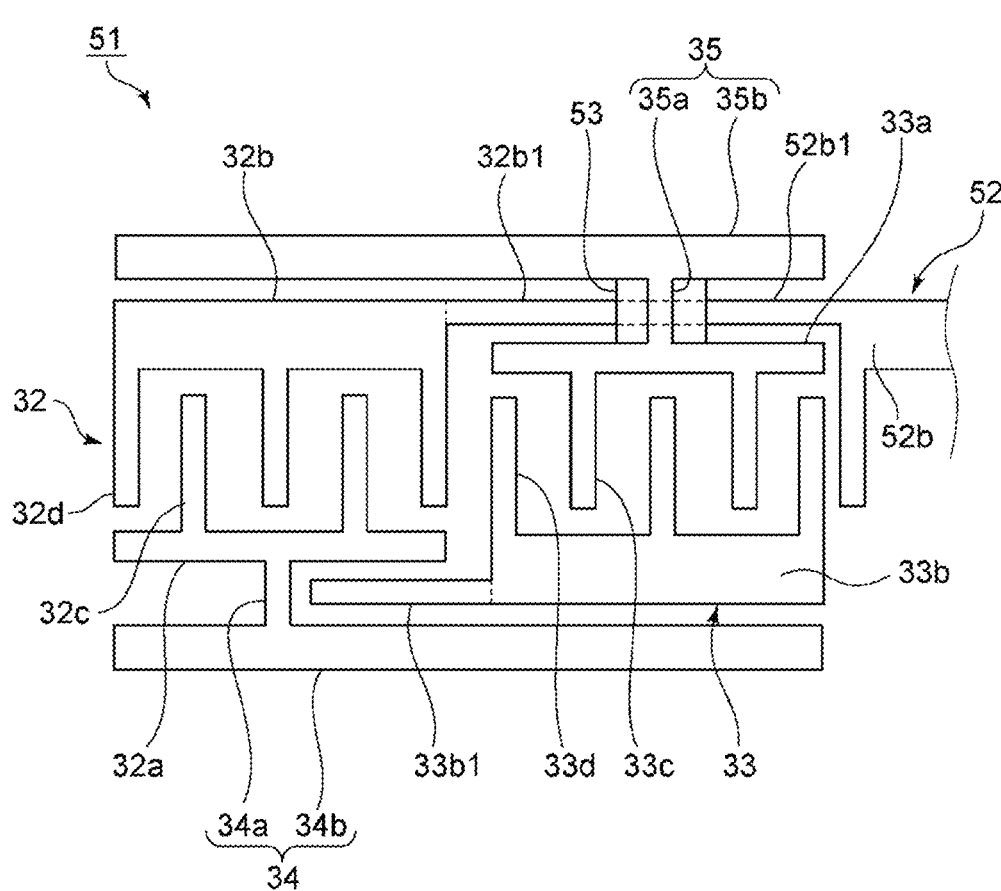
FIG. 8 is a plan view illustrating the main portion of the electrode structure of a longitudinally coupled resonator acoustic wave filter according to a fourth preferred embodiment of the present invention.

FIG. 8 is a plan view illustrating the main portion of the electrode structure of the longitudinally coupled resonator acoustic wave filter 51 according to the fourth preferred embodiment of the present invention.

Here, the IDT electrode 32 and the IDT electrode 33 are configured similarly to those of the longitudinally coupled resonator acoustic wave filter 31 illustrated in FIGS. 6A to 6C. Accordingly, the same components are denoted by the same reference numerals and the descriptions thereof are omitted.

However, the IDT electrode 52 is additionally provided adjacent to a side of the IDT electrode 33 opposite to the IDT electrode 32. When it is assumed that the IDT electrode 32 corresponds to the first IDT electrode and the IDT electrode 33 corresponds to the second IDT electrode, the IDT electrode 52 corresponds to the third IDT electrode. The IDT electrode 52 includes a ground-side busbar 52*b* and a hot-side busbar. In the IDT electrode 52, the ground-side busbar 52*b* is aligned with the hot-side busbar 33*a* of the IDT electrode 33 in the propagation direction of an acoustic wave, that is, in the second direction. In addition, the projecting portion 32*b*1 of the IDT electrode 32 and the projecting portion 52*b*1 of the IDT electrode 52 are connected to each other. In the structure in which the three IDT electrodes 32, 33, and 52 are disposed in the propagation direction of an acoustic wave as described above, the projecting portions 32*b*1 and 52*b*1 of the IDT electrodes 32 and 52 on both sides may be connected to each other. It should be noted that, when the projecting portion 32*b*1 of the IDT electrode 32 is assumed to correspond to the first projecting portion, the projecting portion 52*b*1 of the IDT electrode 52 corresponds to the second projecting portion.

In FIG. 8, the projecting portions 32*b*1 and 52*b*1 are connected to each other as indicated by the dashed lines. In addition, a dielectric film 53 is sandwiched between the first wiring portion 35*a* of the connection wiring 35 and the projecting portions 32*b*1 and 52*b*1 described above. This prevents a short circuit between the connection wiring 35 and the ground-side busbars 32*b* and 52*b*. The dielectric film 53 may be made of an appropriate dielectric. In the present preferred embodiment, the dielectric constant of the dielectric film 53 is smaller than the dielectric constant of the piezoelectric substrate.

When a three-dimensional wiring structure is defined by providing the dielectric film 53 as illustrated in FIG. 8, the area of contact between the connection wiring 35 on the hot side and the piezoelectric substrate having a relatively high dielectric constant can be reduced. Accordingly, degradation of the attenuation characteristics can be suppressed more effectively.

Figure 9:
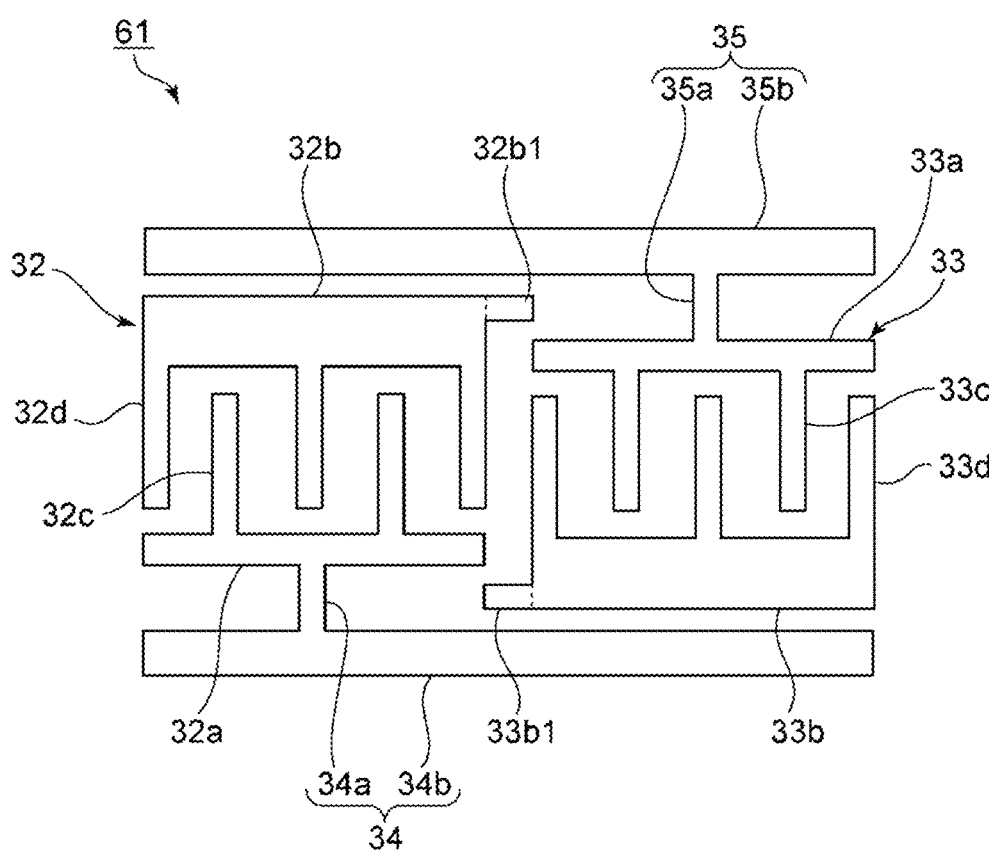
FIG. 9 is a plan view illustrating the main portion of the electrode structure of a longitudinally coupled resonator acoustic wave filter according to a fifth preferred embodiment of the present invention.

FIG. 9 is a plan view illustrating the main portion of the electrode structure of a longitudinally coupled resonator acoustic wave filter 61 according to the fifth preferred embodiment of the present invention. In the longitudinally coupled resonator acoustic wave filter 61, the projecting portion 32*bl* and the projecting portion 33*b*1 extend toward the IDT electrode 33 and the IDT electrode 32, respectively. However, as illustrated in FIG. 9, the tips of the projecting portion 32*bl* and the projecting portion 33*b*1 do not reach the portions that overlap the hot-side busbar 33*a* of the IDT electrode 33 and the hot-side busbar 32*a* of the IDT electrode 32, respectively, in the first direction. As described above, the lengths of the projecting portions 32*b*1 and 33*b*1 may be such that the projecting portions 32*b*1 and 33*bl* do not overlap the adjacent busbars in the first direction.

Figure 10:
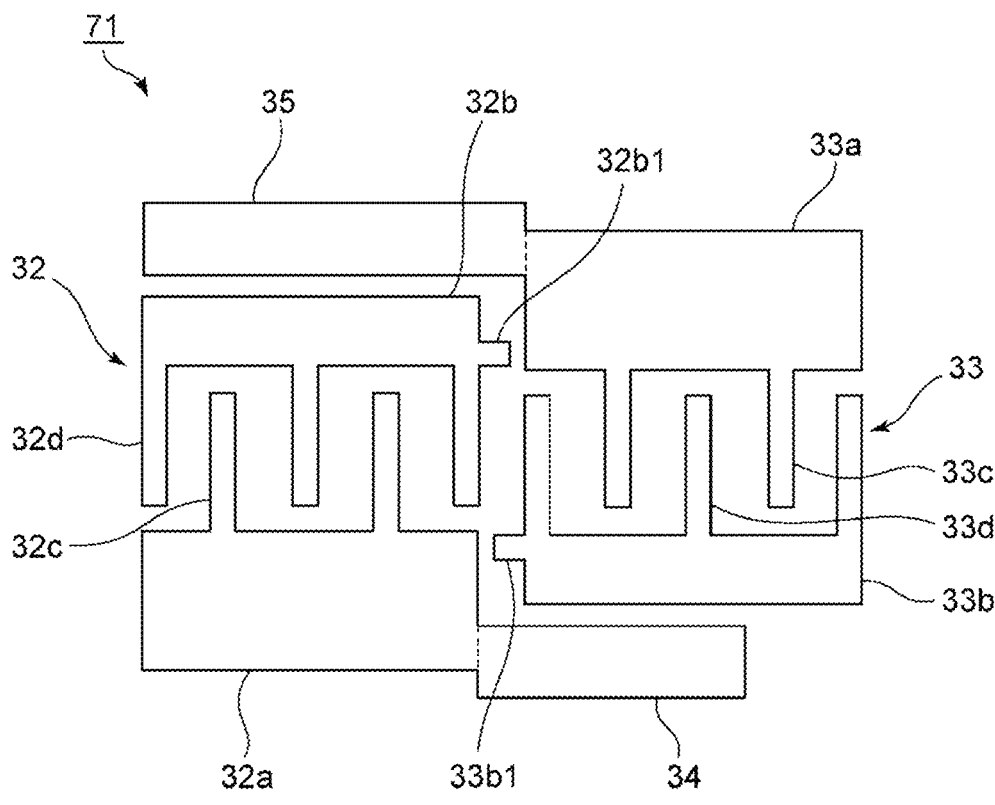
FIG. 10 is a plan view illustrating the main portion of the electrode structure of a longitudinally coupled resonator acoustic wave filter according to a sixth preferred embodiment of the present invention.

FIG. 10 is a plan view illustrating the main portion of the electrode structure of a longitudinally coupled resonator acoustic wave filter according to the sixth preferred embodiment of the present invention. In a longitudinally coupled resonator acoustic wave filter 71, the projecting portion 32*bl* and the projecting portion 33*bl* extend toward the hot-side busbar 33*a* of the IDT electrode 33 and the hot-side busbar 32*a* of the IDT electrode 32, respectively. However, the projecting portion 32*b*1 and the projecting portion 33*bl* extend in the first direction from the end portions of the ground-side busbar 32*b* and the ground-side busbar 33*b*, respectively, close to the interdigitated regions. As described above, the projecting portions may project in the first direction from any positions of the end portions of the ground-side busbars connected.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A longitudinally coupled resonator acoustic wave filter comprising:

a piezoelectric substrate;

a first IDT electrode on the piezoelectric substrate; and a second IDT electrode on the piezoelectric substrate and adjacent to the first IDT electrode; wherein the first IDT electrode includes a hot-side busbar connected to a hot-side potential, a ground-side busbar connected to a ground-side potential, a plurality of first electrode fingers connected to the hot-side busbar, and a plurality of second electrode fingers connected to the ground-side busbar;

the second IDT electrode includes a hot-side busbar connected to a hot-side potential, a ground-side busbar connected to a ground-side potential, a plurality of third electrode fingers connected to the hot-side busbar, and a plurality of fourth electrode fingers connected to the ground-side busbar;

when a direction in which the first to fourth electrode fingers extend is a first direction, a direction perpendicular or substantially perpendicular to the first direction is a second direction, and a region in which the plurality of first electrode fingers and the plurality of second electrode fingers of the first IDT electrode overlap each other in the second direction is an inter-digitated region of the first IDT electrode and a region in which the plurality of third electrode fingers and the plurality of fourth electrode fingers of the second IDT electrode overlap each other in the second direction is an interdigitated region of the second IDT electrode, the ground-side busbar of the first IDT electrode and the hot-side busbar of the second IDT electrode face each other in the second direction, the hot-side busbar of the first IDT electrode and the ground-side busbar of the second IDT electrode face each other in the second direction, and a projecting portion extending in the second direction toward the second IDT electrode beyond the interdigitated region of the first IDT elec-trode is provided, the projecting portion being con-nected to the ground-side busbar of the first IDT electrode; and the projecting portion extends in the second direction toward the second IDT electrode beyond an end portion of the hot-side busbar of the second IDT electrode, the end portion being adjacent to the first IDT electrode.

2. The longitudinally coupled resonator acoustic wave filter according to claim 1, further comprising a dielectric film covering the first and second IDT electrodes.

3. The longitudinally coupled resonator acoustic wave filter according to claim 1, wherein the projecting portion extends in the second direction in a region on a side of the hot-side busbar of the second IDT electrode, the side being opposite to the interdigitated region of the second IDT electrode.

4. The longitudinally coupled resonator acoustic wave filter according to claim 1, wherein each of the first and second IDT electrodes includes a main portion and a narrow-pitch portion in which an electrode finger pitch is less than that in the main portion.

5. The longitudinally coupled resonator acoustic wave filter according to claim 1, wherein the projection portion is provided in ground-side busbars of all IDT electrodes included in the longitudinally coupled resonator acoustic wave filter.

6. The longitudinally coupled resonator acoustic wave filter according to claim 1, further comprising:

a connection wiring connected to an edge of the hot-side busbar of the second IDT electrode, the edge being on a side opposite to the interdigitated region of the second IDT electrode; wherein the connection wiring includes a first wiring portion connected to the hot-side busbar of the second IDT electrode and a second wiring portion connected to an end portion of the first wiring portion, the end portion being on a side opposite to a portion of the first wiring portion connected to the hot-side busbar, the second wiring portion extending in the second direction.

7. The longitudinally coupled resonator acoustic wave filter according to claim 6, wherein the projecting portion reaches a region surrounded by the hot-side busbar of the second IDT electrode, the first wiring portion, and the second wiring portion.

8. The longitudinally coupled resonator acoustic wave filter according to claim 6, wherein a height of the projecting portion is lower than a height of the hot-side busbar of the second IDT electrode and a height of the connection wiring.

9. The longitudinally coupled resonator acoustic wave filter according to claim 6, wherein a height of the projecting portion is higher than a height of the hot-side busbar of the second IDT electrode and a height of the connection wiring.

10. The longitudinally coupled resonator acoustic wave filter according to claim 6, wherein the projecting portion extends to a portion below the first wiring portion of the connection wiring and a dielectric film is provided between the projecting portion and the first wiring portion.

11. The longitudinally coupled resonator acoustic wave filter according to claim 10, wherein a dielectric constant of the dielectric film is smaller than a dielectric constant of the piezoelectric substrate.

12. The longitudinally coupled resonator acoustic wave filter according to claim 1, further comprising:

a third IDT electrode disposed on a side opposite to the first IDT electrode in the second direction with respect to the second IDT electrode; wherein the third IDT electrode includes a ground-side busbar connected to a ground-side potential, a hot-side busbar connected to a hot-side potential, and a second project-ing portion that is connected to the ground-side busbar and extends in the second direction toward the second IDT electrode, and the second projecting portion of the third IDT electrode is connected to the projecting portion of the first IDT electrode.

13. The longitudinally coupled resonator acoustic wave filter according to claim 1, wherein the longitudinally coupled resonator acoustic wave filter is a 5-IDT longitudi-nally coupled resonator surface acoustic wave filter.

14. The longitudinally coupled resonator acoustic wave filter according to claim 1, wherein the longitudinally coupled resonator acoustic wave filter is a reception filter for Band 66.

15. The longitudinally coupled resonator acoustic wave filter according to claim 1, further comprising an antenna terminal, a reception terminal, and first and second series resonators.

16. A longitudinally coupled resonator acoustic wave filter comprising:

a piezoelectric substrate;

a first IDT electrode on the piezoelectric substrate; and a second IDT electrode on the piezoelectric substrate and adjacent to the first IDT electrode; wherein the first IDT electrode includes a hot-side busbar con-nected to a hot-side potential, a ground-side busbar connected to a ground-side potential, a plurality of first electrode fingers connected to the hot-side busbar, and a plurality of second electrode fingers connected to the ground-side busbar;

the second IDT electrode includes a hot-side busbar connected to a hot-side potential, a ground-side busbar connected to a ground-side potential, a plurality of third electrode fingers connected to the hot-side busbar, and a plurality of fourth electrode fingers connected to the ground-side busbar;

when a direction in which the first to fourth electrode fingers extend is a first direction, a direction perpen-dicular or substantially perpendicular to the first direc-tion is a second direction, and a region in which the plurality of first electrode fingers and the plurality of second electrode fingers of the first IDT electrode overlap each other in the second direction is an inter-digitated region of the first IDT electrode and a region in which the plurality of third electrode fingers and the plurality of fourth electrode fingers of the second IDT electrode overlap each other in the second direction is an interdigitated region of the second IDT electrode, the ground-side busbar of the first IDT electrode and the hot-side busbar of the second IDT electrode face each other in the second direction, the hot-side busbar of the first IDT electrode and the ground-side busbar of the second IDT electrode face each other in the second direction, and a projecting portion extending in the second direction toward the second IDT electrode beyond the interdigitated region of the first IDT electrode is provided, the projecting portion being connected to the ground-side busbar of the first IDT electrode; and a width in the first direction of the hot-side busbar of the second IDT electrode tapers from a middle of the hot-side busbar of the second IDT electrode toward both ends in the second direction of the hot-side busbar of the second IDT electrode.

17. A longitudinally coupled resonator acoustic wave filter comprising:

a piezoelectric substrate;

a first IDT electrode on the piezoelectric substrate; and a second IDT electrode on the piezoelectric substrate and adjacent to the first IDT electrode; wherein the first IDT electrode includes a hot-side busbar connected to a hot-side potential, a ground-side busbar connected to a ground-side potential, a plurality of first electrode fingers connected to the hot-side busbar, and a plurality of second electrode fingers connected to the ground-side busbar;

the second IDT electrode includes a hot-side busbar connected to a hot-side potential, a ground-side busbar connected to a ground-side potential, a plurality of third electrode fingers connected to the hot-side busbar, and a plurality of fourth electrode fingers connected to the ground-side busbar;

14 when a direction in which the first to fourth electrode fingers extend is a first direction, a direction perpendicular or substantially perpendicular to the first direction is a second direction, and a region in which the plurality of first electrode fingers and the plurality of second electrode fingers of the first IDT electrode overlap each other in the second direction is an interdigitated region of the first IDT electrode and a region in which the plurality of third electrode fingers and the plurality of fourth electrode fingers of the second IDT electrode overlap each other in the second direction is an interdigitated region of the second IDT electrode, the ground-side busbar of the first IDT electrode and the hot-side busbar of the second IDT electrode face each other in the second direction, the hot-side busbar of the first IDT electrode and the ground-side busbar of the second IDT electrode face each other in the second direction, and a projecting portion extending in the second direction toward the second IDT electrode beyond the interdigitated region of the first IDT electrode is provided, the projecting portion being connected to the ground-side busbar of the first IDT electrode; and when a distance between an end portion of the projecting portion, the end portion being adjacent to the interdigitated region of the second IDT electrode, and an edge to which the plurality of third electrode fingers of the hot-side busbar of the second IDT electrode are connected is d1 and a distance between the hot-side busbar of the second IDT electrode and the ground-side busbar of the second IDT electrode is d2, d1<d2 is satisfied.

* * * * *